United States Patent [19]

Imura

[11] Patent Number: 5,731,962
[45] Date of Patent: Mar. 24, 1998

[54] SEMICONDUCTOR DEVICE FREE FROM SHORT-CIRCUIT DUE TO RESIN PRESSURE IN MOLD

[75] Inventor: Tomoo Imura, Kumamoto, Japan

[73] Assignee: NEC Corporation, Tokyo, Japan

[21] Appl. No.: 532,885

[22] Filed: Sep. 22, 1995

[30] Foreign Application Priority Data

Sep. 22, 1994 [JP] Japan .................... 6-227814

[51] Int. Cl.⁶ ............... H01L 23/495; H01L 23/522
[52] U.S. Cl. .................... 361/813; 257/669; 257/674; 257/691; 174/52.4
[58] Field of Search ................... 257/666, 668, 257/669, 672, 674, 670, 676, 691, 735, 736; 174/52.2, 52.4; 437/217, 219, 220; 29/827; 264/272.17; 361/813

[56] References Cited

U.S. PATENT DOCUMENTS 4,951,120  8/1990  Hagiwara et al. .............. 257/666

FOREIGN PATENT DOCUMENTS

| 2-125652 | 5/1990 | Japan | 257/666 |
| 2121361 | 5/1990 | Japan . | |
| 2-146740 | 6/1990 | Japan | 257/787 |
| 4-025144 | 1/1992 | Japan | 437/220 |
| 6-216303 A | 8/1994 | Japan | 257/676 |

OTHER PUBLICATIONS

"Development of Ultra Fine QFP", *NEC Technical Report*, vol. 47, No. Mar. 1994, pp. 34–37.

*Primary Examiner*—Leo P. Picard
*Assistant Examiner*—John B. Vigushin
*Attorney, Agent, or Firm*—Sughrue, Mion, Zinn, Macpeak & Seas, PLLC

[57] ABSTRACT

A semiconductor chip mounted on an island is electrically connected to inner leads through tape-automated bonding leads supported by an insulating suspender tape, and a support ring is connected between the insulating suspender tape and suspender pins connected to the island so as to maintain an original relative position between the semiconductor chip and the tape-automated bonding leads during a molding stage.

25 Claims, 11 Drawing Sheets

SEMICONDUCTOR DEVICE FREE FROM SHORT-CIRCUIT DUE TO RESIN PRESSURE IN MOLD

FIELD OF THE INVENTION

This invention relates to a semiconductor device and, more particularly, to a semiconductor device sealed in a plastic package without undesirable short-circuit.

DESCRIPTION OF THE RELATED ART

An integrated circuit fabricated on a semiconductor chip has been complicated, and the complicated integrated circuit usually requires a large number of pins for communicating with other components of an electronic system. The electronic system is getting smaller and smaller, and, accordingly, requires semiconductor manufacturer to scale down the integrated circuit devices.

Various packaging technologies have been proposed for the semiconductor integrated circuit devices, and a quad flat package is attractive in view of the scale-down and a high-density pin arrangement. The quad flat package is sometimes abbreviated as "QFP".

However, the manufacturer is required to fabricate the quad flat package at a high precision and reliability. In general, a semiconductor chip is mounted on a lead-frame in the quad flat package, and the electrodes of the semiconductor chip are electrically connected through bonding wires to the inner leads of the lead-frame. The wire bonder individually connects the electrodes to the inner leads, and accounts for large amount of time and cost in the assembling stage. Moreover, the quad flat package reaches the limit of the high-density pin arrangement, and the extremely thin bonding wires hardly bridge wide gaps between the electrodes of the semiconductor chip and the inner leads.

A tape automated bonding technology has been superseded the quad flat packaging technology. A copper film is laminated on a film tape, and is patterned into a lead-frame pattern through a lithographic process. Gold bumps are formed on a semiconductor chip, and the gold bumps are concurrently bonded to the lead-frame pattern. The tape automated bonding achieves a high throughput, a low cost and a high-density through the concurrent bonding technique between the leads and the electrodes of the semiconductor chip.

Figure 1:
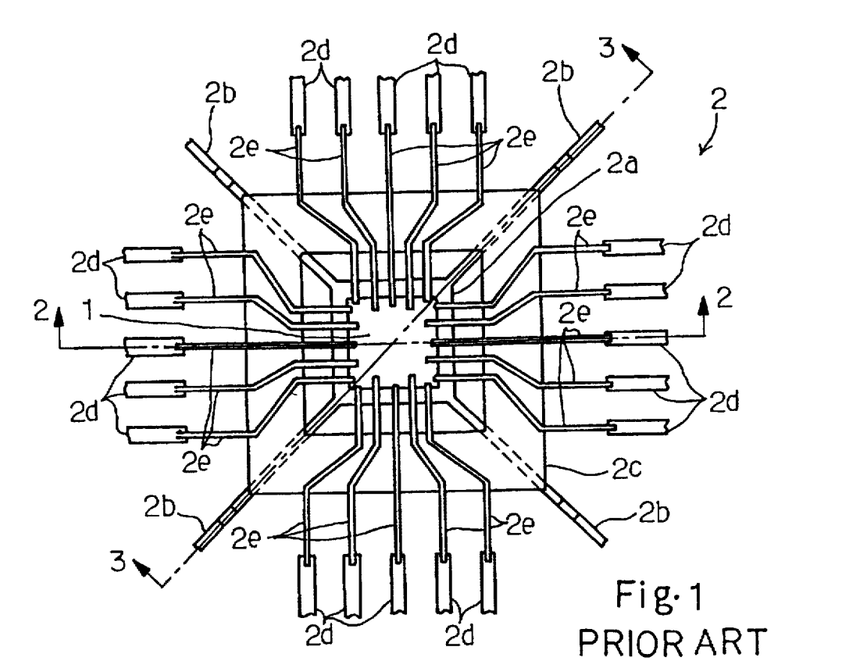
FIG. 1 is a plan view showing the structure of the prior art plastic-molded semiconductor device.
Figure 2:
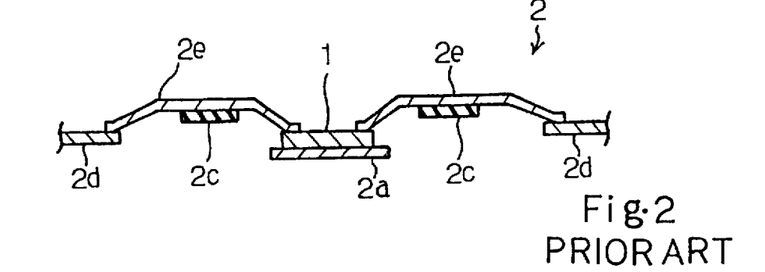
FIG. 2 is a cross sectional view taken along line 2—2 and showing the structure of the prior art plastic-molded semiconductor device.
Figure 3:
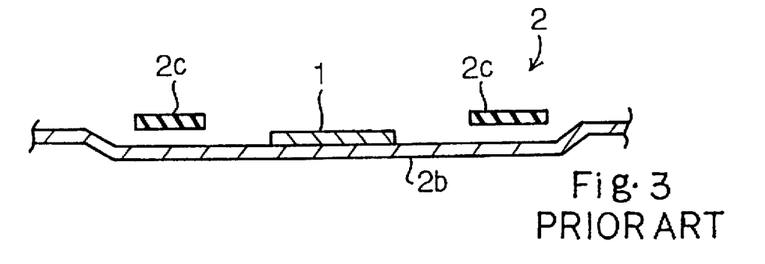
FIG. 3 is a cross sectional view taken along line 3—3 and showing the structure of the prior art plastic-molded semiconductor device from a different angle.

A typical example of the tape automated bonding technology is disclosed by Uno et.al. in "Development of Ultra Fine Pitch QFP", NEC Technical Report, vol. 47, No. 3/1994, pages 34 to 37. FIGS. 1 to 3 illustrate the prior art plastic-molded semiconductor device corresponding to the TAB-QFP structure shown in FIG. 1 of the NEC Technical Report.

The prior art plastic-molded semiconductor device comprises a semiconductor chip 1 and a frame structure 2. The frame structure 2 supports the semiconductor chip 1, and provides electrical connections for the semiconductor chip 1.

The frame structure 2 includes an island 2a supported by suspenders 2b and an insulating suspender tape 2c provided around the island 2a, and the semiconductor chip 1 is mounted on the island 2a.

The frame structure 2 further includes inner leads 2d of a lead-frame arranged around the insulating suspender tape 2c and tap-automated bonding leads 2e connecting the inner leads 2d to electrodes of the semiconductor chip 1. The tape-automated bonding leads 2e are fixed to the insulating suspender tape 2c, and, accordingly, the insulating suspender tape 2c maintains the tape-automated bonding leads 2e at 80 microns on the inner side of the insulating suspender tape 2c. The suspenders 2b are upwardly bent at both end portions thereof (see FIG. 3), and pass under the insulating suspender tape 2c. For this reason, the insulating suspender tape 2c is only supported by the tape-automated bonding leads 2e. The tape-automated bonding leads 2e are only 30 microns in width, and downwardly bent at both end portions thereof (see FIG. 2) so as to electrically connect the inner edges of the inner leads 2d to the electrodes of the semiconductor chip 1. Both end portions downwardly bent allow the insulating suspender tape to be horizontal without contact with the suspenders 2b. However, the narrow tape-automated bonding leads 2e are extremely small in mechanical strength.

Figures 4A, 4B:
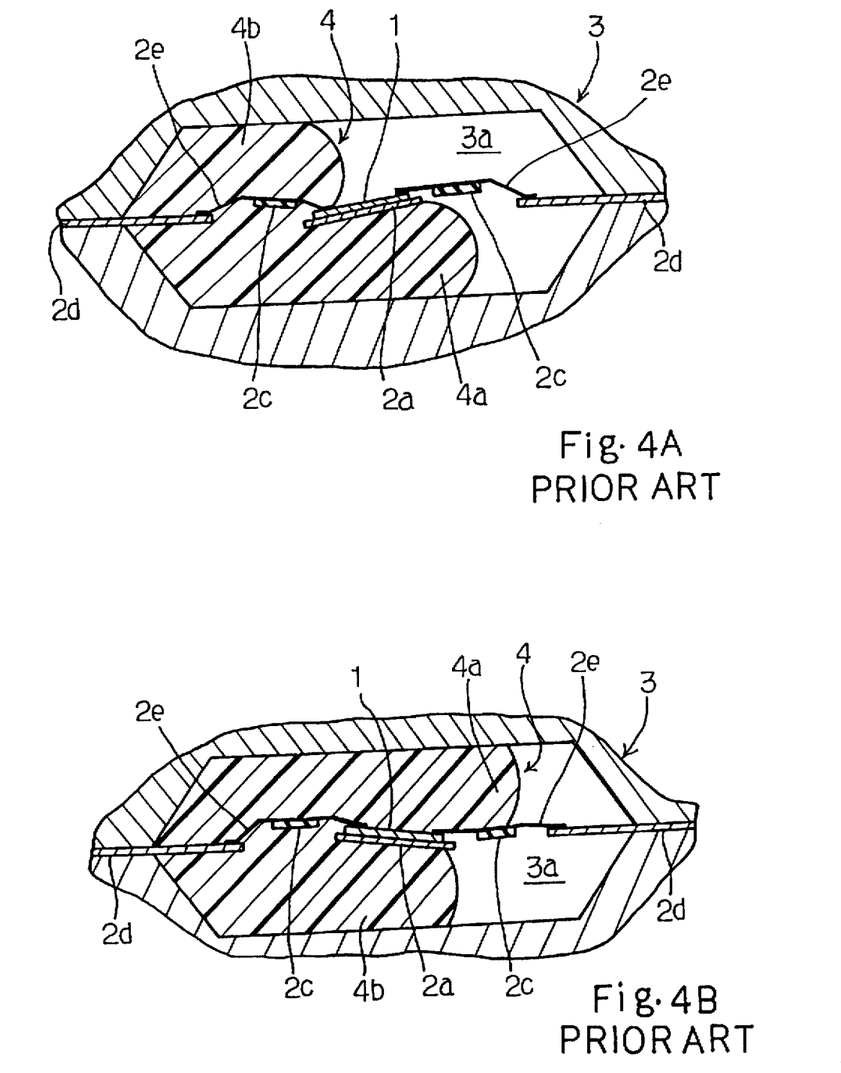
FIGS. 4A and 4B are cross sectional views showing the molding stage for the prior art plastic-molded semiconductor device.

Upon completion of the electrical connection between the lead-frame and the semiconductor chip 1 fixed to the island 2a, the resultant structure is molded in plastic resin, and FIGS. 4A and 4B illustrate the molding stage. In detail, a mold 3 is prepared, and the resultant structure is put into the mold 3. The inner leads 2d are caught in the mold 3, and support the semiconductor chip 1 connected through the tape-automated bonding leads 2e. Resin 4 is injected into the inner space 3a of the mold 3, and is spread over the inner space 3a.

However, the resin 4 is not uniformly spread over the inner space 3a. If the resin 4a is spread under the island 2a faster than the resin 4b over the semiconductor chip 1, the resin 4a pushes up the island, and the semiconductor chip 1 on the island 2a declines as shown in FIG. 4A. The semiconductor chip 1 deforms the tape-automated bonding leads 2e, and varies the relative relation between the suspender tape/the tape-automated bonding leads 2e and the island 2a/the semiconductor chip 1. The tape-automated bonding leads 2e are so thin and narrow that the resin 4a can easily deform the leads 2e through the semiconductor chip 1.

On the other hand, if the resin 4a is spread over the semiconductor chip 1 faster than the resin 4b under the island 2a, the resin 4a pushes down the semiconductor chip 1, and the semiconductor chip 1 on the island 2a declines as shown in FIG. 4B. The semiconductor chip 1 thus pushed down deforms the tape-automated bonding leads 2e, and the relative relation is also varied.

When the relative position between the tape-automated bonding leads 2e and the semiconductor chip 1 is varied, undesirable short circuit tends to take place, and decreases the production yield.

Figure 5:
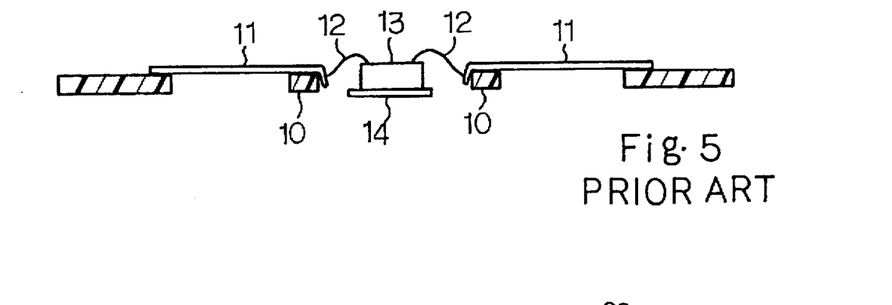
FIG. 5 is a cross sectional view showing the structure of the prior art lead-frame disclosed in Japanese Patent Publication of Unexamined Application No. 2-121361.

Japanese Patent Publication of Unexamined Application No. 2-121361 discloses another prior art lead-frame for a semiconductor chip, and FIG. 5 illustrates the prior art lead-frame disclosed in the Japanese Patent Publication of Unexamined Application. An insulating suspender 10 supports leads 11, and wires 12 provide electrical connections between the leads 11 and a semiconductor chip 13 on an island 14. Although the insulating suspender 10 reinforces the leads 11, the semiconductor chip 13 on the island 14 is also unstable, and is liable to change the relative position in a mold (not shown) due to resin injected into the mold. Thus, the second prior art lead-frame also suffers from the same problem as the first prior art lead-frame.

SUMMARY OF THE INVENTION

It is therefore an important object of the present invention to provide a semiconductor device which is prevented from undesirable short-circuit due to resin pressure in a molding stage.

To accomplish the object, the present invention proposes to fix the relative position between suspender tape and an island where a semiconductor chip is mounted.

In accordance with the present invention, there is provided a semiconductor device comprising: a semiconductor chip including a plurality of contact electrodes; a lead-frame structure including an island sub-structure having an island portion for mounting the semiconductor chip, a plurality of first leads arranged around the island portion, a plurality of second leads having respective inner end portions respectively connected to the plurality of contact electrodes and respective outer end portions respectively connected to the plurality of first leads, an insulating suspender provided between the plurality of first leads and the island portion and connected to intermediate portions of the plurality of second leads so as to keep a relative relation among the plurality of second leads unchanged, and a support member connected between the insulating suspender and the island substructure so as to keep a relative relation therebetween; and a package molded for sealing the semiconductor chip and the lead-frame structure therein.

BRIEF DESCRIPTION OF THE DRAWINGS

The features and advantages of the semiconductor device according to the present invention will be more clearly understood from the following description taken in conjunction with the accompanying drawings in which.

DESCRIPTION OF THE PREFERRED
EMBODIMENTS

First Embodiment

Figure 6:
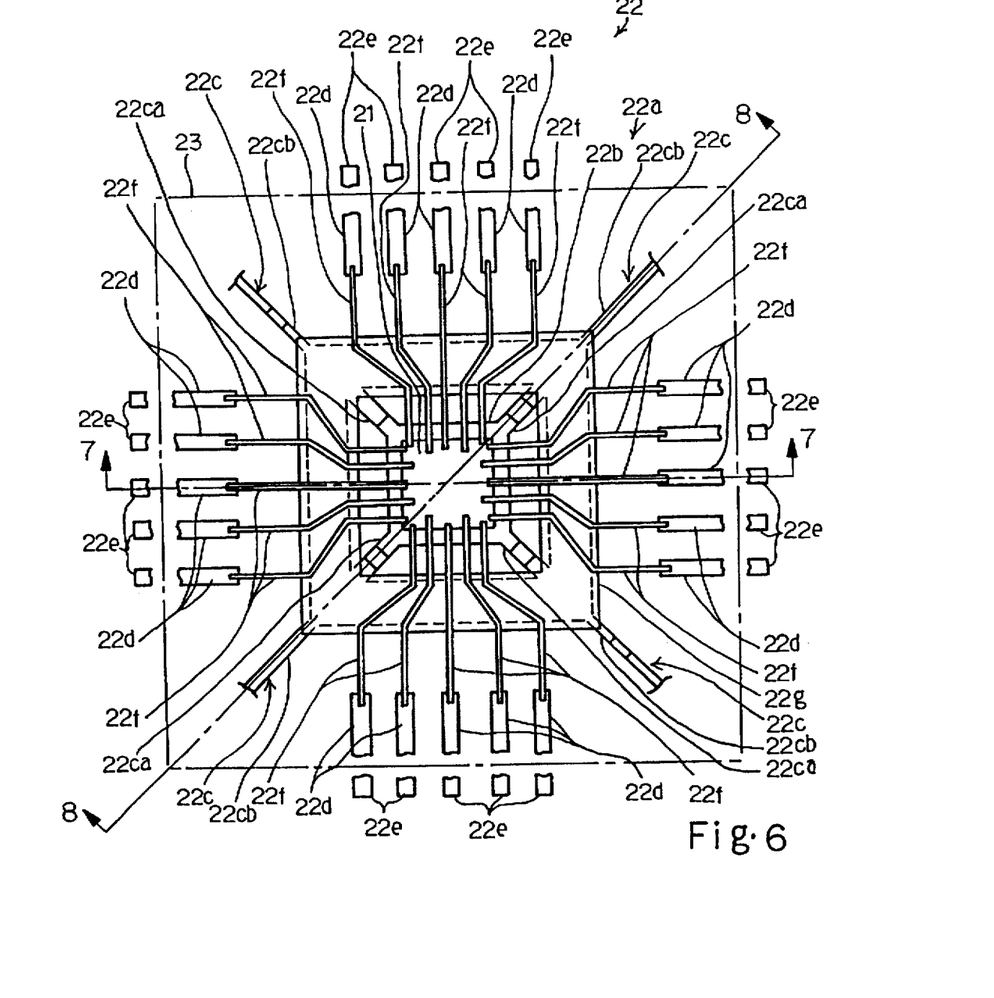
FIG. 6 is a plan view showing a semiconductor chip assembled with a lead-frame according to the present invention.
Figure 7:
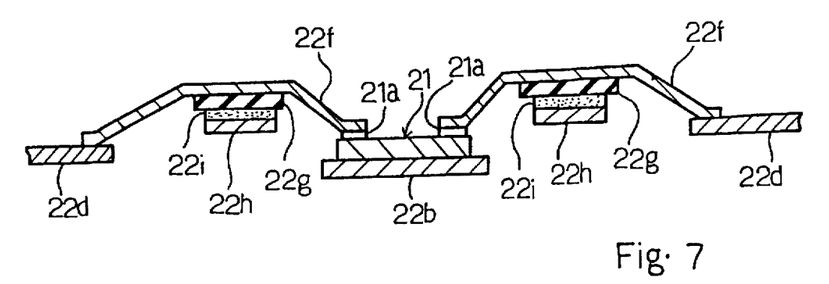
FIG. 7 is a cross sectional view taken along line 7—7 of FIG. 6 and showing the inner structure of the semiconductor device according to the present invention.
Figure 8:
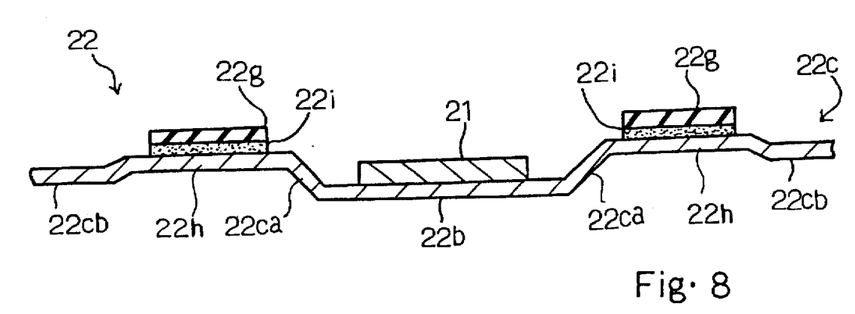
FIG. 8 is a cross sectional view taken along line 8—8 of FIG. 6 and showing the inner structure of the semiconductor device from a different angle.

Referring to FIGS. 6 to 8 of the drawings, a semiconductor device embodying the present invention largely comprises a semiconductor chip 21, a lead-frame structure 22 assembled with the semiconductor chip 21 for providing electrical paths thereto and a plastic package 23 for sealing the semiconductor chip 21 and the lead-frame structure 22 therein.

A large number of circuit components (not shown) are fabricated in the semiconductor chip 21, and form an integrated circuit. A plurality of contact electrodes 21a are provided on the top surface of the semiconductor chip 21, and supply electric power and signals to and from the integrated circuit. The semiconductor chip may be a kind of discrete device.

The lead-frame structure 22 includes an island substructure 22a. A square island 22b and suspension pins 22c form in combination the island sub-structure 22a, and the suspension pins 22c are partially wide and partially narrow. The wide inner portions 22ca of the suspension pins 22c are merged with four corners of the square island 22b, and support the square island 22b. The semiconductor chip 21 is mounted on and fixed to the square island 22b.

The lead-frame structure 22 further includes a plurality of inner leads 22d arranged around the square island 22b. The inner leads 22d are electrically connected to outer leads 22e, respectively, and the outer leads 22e project from the plastic package 23.

The lead-frame structure 22 further includes a plurality of tape-automated bonding leads 22f connected between the inner leads 22d and the contact electrodes 21a of the semiconductor chip 21 and an insulating suspender tape 22g provided beneath the tape-automated bonding leads 22f. The tape-automated bonding leads 22f are as thin and narrow as the tape-automated bonding leads 2e (FIG. 1–4 ), and are easily deformable. The tape-automated bonding lead 22f has an outer portion and an inner portion both downwardly bent, and the outer portion and the inner portion are bonded to the inner lead 22d and the contact electrode 21a, respectively. The inner/outer end portions of the tape-automated bonding lead 22f thus downwardly bent are surely in contact with the target contact electrode 21a and the target inner lead 22d, and are effective against undesirable contact with another conductive portion. The insulating suspender tape 22g is looped, and the semiconductor chip 21 on the island 22b is exposed to the inside of the insulating suspender tape 22g. The insulating suspender tape 22g has a top surface, and the intermediate portions of the tape-automated bonding leads 22f are fixed to the top surface of the insulating suspender tape 22g at intervals. The downwardly bent inner/outer end portions of the tape-automated bonding leads 22f keep the insulating suspender tape 22g horizontal. The insulating suspender tape 22g electrically isolates the tape-automated bonding leads 22f from one another, and fixes the relative relation among the tape-automated bonding leads 22f.

The lead-frame structure 22 further includes a conductive support ring 22h bonded by adhesive compound layer 22i to a reverse surface of the insulating suspender tape 22g by means of suitable adhesion compound. The conductive support ring 22h is not wider than the insulating suspender tape 22g, and the insulating suspender tape 22g prevents the tape-automated bonding leads 22f from undesirable electrical connection through the conductive support ring 22h.

As will be better seen in FIG. 8, the suspension pins 22c are appropriately bent so as to adjust the height to the semiconductor chip 21, the conductive support ring 22h and the inner leads 22d, and the wide inner portions 22ca are connected to the conductive support ring 22h.

Figure 9A:
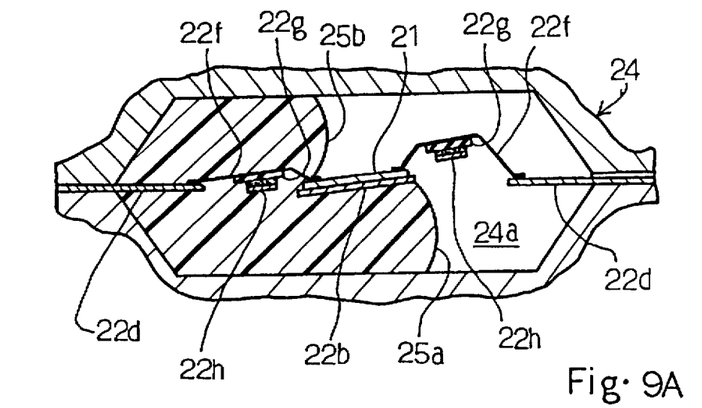
FIG. 9A and 9B are cross sectional views showing the semiconductor device in a molding stage.
Figure 9B:
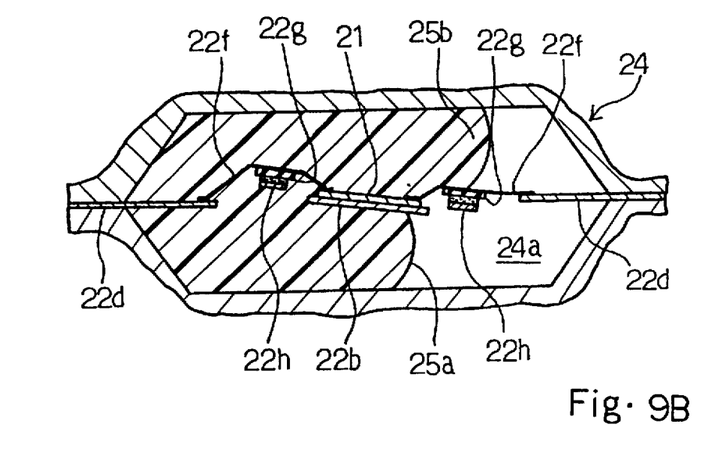

The lead-frame structure 22 assembled with the semiconductor chip 21 is sealed in the plastic package 23. FIGS. 9A and 9B illustrate the molding stage. A mold 24 is prepared, and the lead-frame structure 22 assembled with the semiconductor chip 21 are accommodated in the mold 24 as similar to the prior art. Plastic resin is injected into an inner space 24a, and is spread over the inner space 24a. If the plastic resin 25a under the island 22b is spread faster than the plastic resin 25b over the semiconductor chip 21, the plastic resin 25a pushes up the island 22b, and causes the island 22b and the semiconductor chip 21 to decline as shown in FIG. 9A. The narrow outer portions 22cb are bent, and the tape-automated bonding leads 22f are also deformed. However, the wide inner portions 22ca are not deformed, and the support ring 22h does not allow the island 22b and the insulating suspender tape 22g to change the original relative position therebetween. Accordingly, the tape-automated bonding leads 22f keep the original relative position to the semiconductor chip 21, and an undesirable short-circuit does not take place.

On the other hand, if the plastic resin 25b over the semiconductor device 21 is spread faster than the plastic resin 25a, the plastic resin 25b pushes down the semiconductor chip 21, and causes the semiconductor chip on the island 22b to decline as shown in FIG. 9B. The narrow outer portions 22cb allow the island 22b to decline through deformation thereof, and the tape-automated bonding leads 22f are also deformed so as to allow the semiconductor chip 21 to decline. However, the wide inner portions 22ca maintain the relative position between the semiconductor chip 21/the island 22b and the insulating suspender tape 22g/the tape-automated bonding leads 22f in cooperation with the conductive support ring 22h.

Thus, the conductive support ring 22h maintains the original relative position between the tape-automated bonding leads 22f and the semiconductor chip 21, and prevents the semiconductor device from undesirable short-circuit. In other words, the conductive support ring 22h enhances the production yield of the semiconductor device.

The support ring 22h may be formed of insulating substance in so far as it is merely expected to prevent the semiconductor device from undesirable short-circuit.

Second Embodiment

Figure 10:
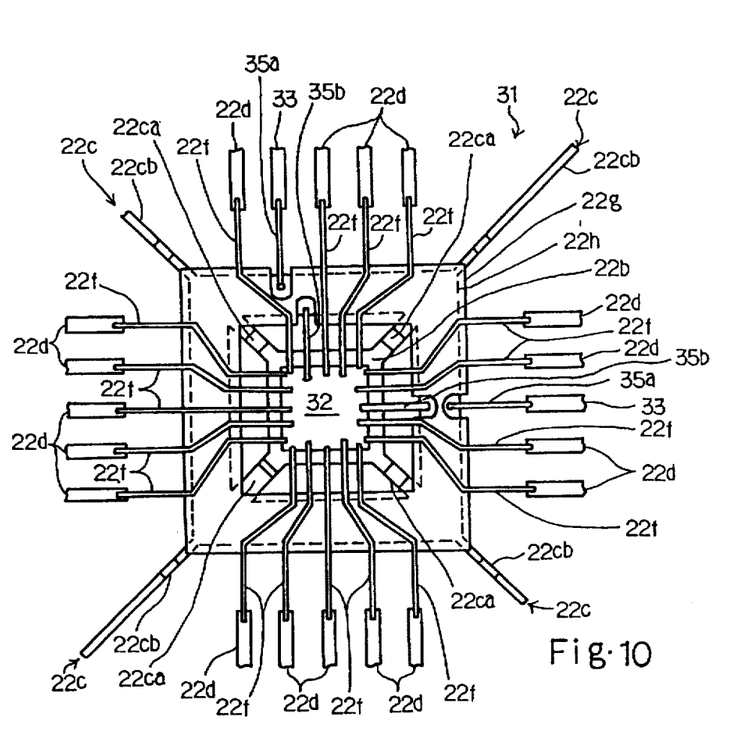
FIG. 10 is a plan view showing a lead-frame structure assembled with a semiconductor chip according to the present invention.

FIG. 10 illustrates a lead-frame structure 31 assembled with a semiconductor chip 32, and the lead-frame 31 and the semiconductor chip 32 form parts of another semiconductor device embodying the present invention. The lead-frame structure 31 is similar to the lead-frame structure 22 except for an electrical connection between inner leads 33 assigned to an electric power and contact electrodes 34 on the semiconductor chip 32, and for this reason, the other component parts and members are labeled with the same references designating corresponding parts and members of the first embodiment without detailed description.

The electrical connection is implemented by conductive wires 35a and 35b. As will be better seen in FIG. 11, the insulating suspender tape 22g is partially cut away, and the conductive support ring 22h is partially exposed on both sides, i.e., the inside and the outside thereof. The inner leads 33 are connected through the conductive wires 35a to the conductive support ring 22h, and the conductive wires 35b electrically connect the conductive support ring 22h to the electrodes 34. The conductive wires 35a and 35b are connected to the inner leads 33, the conductive support ring 22h and the contact electrodes 34 by using a wire bonding machine.

Figure 11:
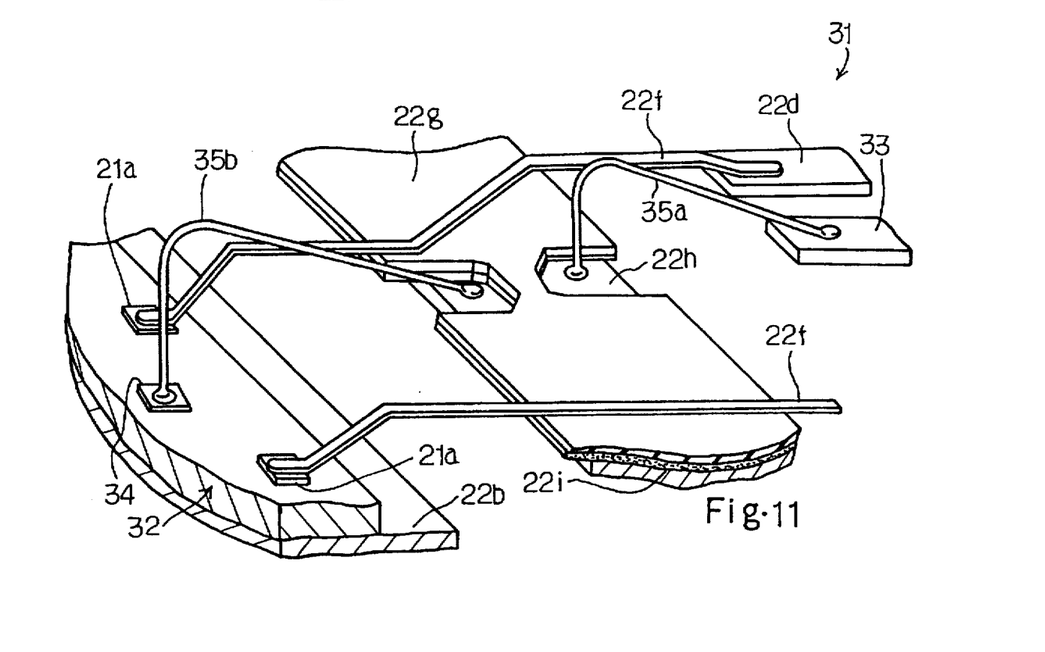
FIG. 11 is a perspective view showing wires connecting a power supply lead through a conductive support ring to a contact electrode of the semiconductor chip.

Either high or low power voltage is supplied from the inner leads 33 through the conductive support ring 22h to the electrodes 34, and the high or low power voltage is distributed from the contact electrodes 34 to the integrated circuit. Thus, the conductive support ring 22h not only keeps the original relative position between the island 22b and the tape-automated bonding leads 22f but also serves as an electric power distribution plane. The conductive support ring 22h of the second embodiment achieves a high production yield and a stable electric power supply, and the high or low power voltage hardly fluctuates.

Although two sets of conductive wires 35a/35b connect the inner leads 33 through the conductive support ring 22h to the contact electrodes 34, only one inner lead or more than two inner leads may be assigned to the power voltage. If so, a pair of conductive wires 35a/35b or more than two pairs of conductive wires 35a/35b are incorporated in the lead-frame structure.

Third Embodiment

Figure 12:
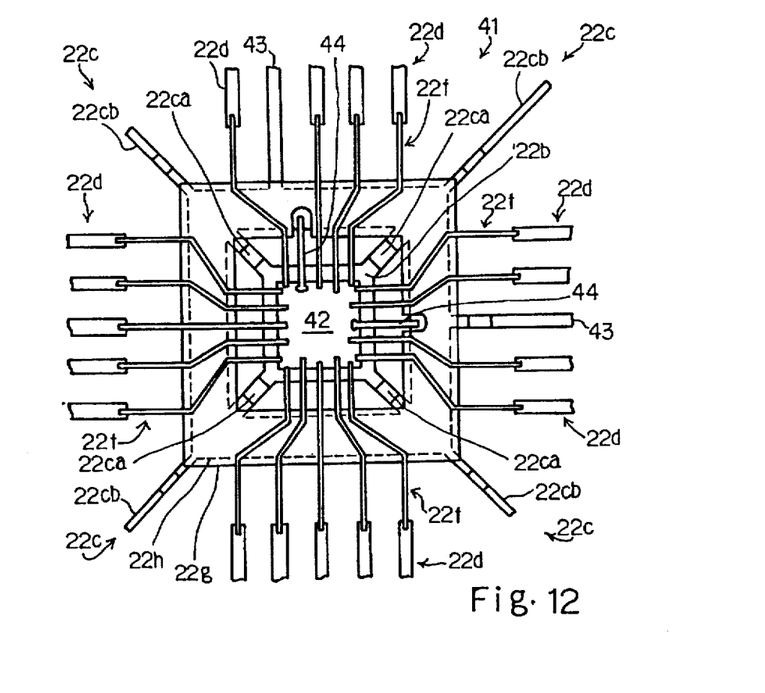
FIG. 12 is a plan view showing a lead-frame structure assembled with a semiconductor chip according to the present invention.
Figure 13:
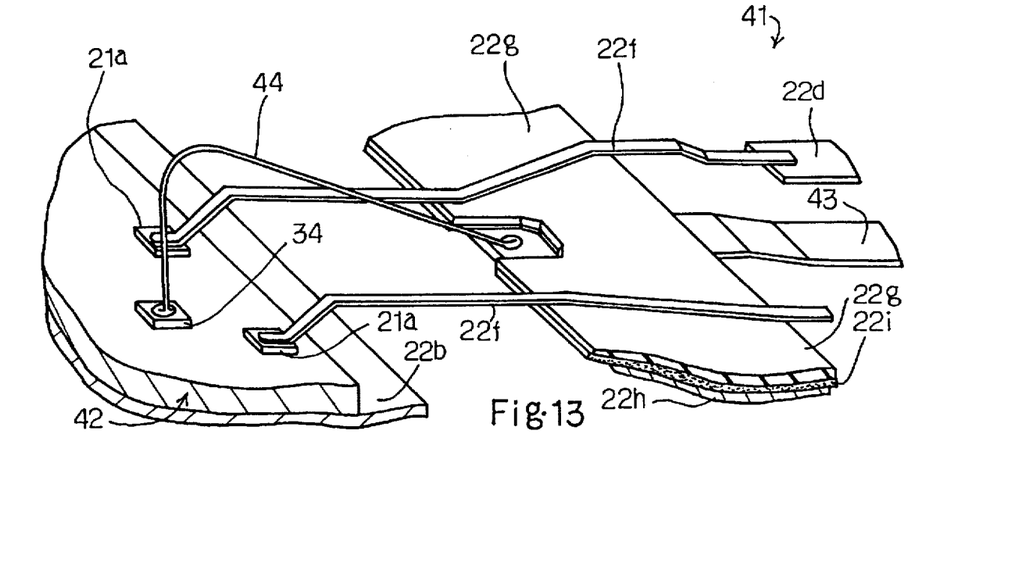
FIG. 13 is a perspective view showing a prolonged inner lead and a wire which supply an electric power through a conductive support ring to a contact electrode of the semiconductor chip.

FIGS. 12 and 13 illustrate a lead-frame 41 assembled with a semiconductor chip 42, and the lead-frame structure 41 and the semiconductor chip 42 form parts of yet another semiconductor device embodying the present invention. The lead-frame structure 41 is similar to that of the second embodiment, and the conductive support ring 22h also serves as a power supply plane for either high or low power voltage. The same references as those used in FIGS. 10 and 11 designate corresponding parts and members of the lead-frame structure 41, respectively, and description is focused on a difference between the second embodiment and the third embodiment.

The difference between the lead-frame structures 31 and 41 is the electrical connection to the contact electrode 33. As described hereinbefore, the conductive metal wires 35a and 35b provide the electrical connection from the inner lead 33 through the conductive support ring 22h to the contact electrode 34 in the second embodiment. In this instance, the electrical connection is implemented by prolonged inner leads 43 and conductive metal wires 44.

In detail, the inner leads assigned to either high or low power voltage are prolonged, and are directly connected to the conductive support ring 22h. The suspender tape 22g is partially cut away, and the conductive support ring 22h is exposed at two portions on the inside thereof. The conductive metal wires 44 are bonded at outer ends thereof to the exposed inside portions of the conductive support ring 22h and at the outer ends thereof to the contact electrodes 34. The conductive wires 44 are half of the conductive wires 35a and 35b, and the lead-frame structure 41 is more economical than the lead-frame structure 31.

The high or low power voltage is supplied from the prolonged inner leads 43 through the conductive support ring 22h to the contact electrodes 34, and is distributed to the integrated circuit of the semiconductor chip 42.

Only one set of the inner lead 43 and the conductive metal wire 44 may be used for the power voltage, and the set may be multiplied more than two.

Thus, the conductive support ring 22h of the lead-frame structure 41 is conductive to the enhancement of the production yield and the stable power supply as similar to the conductive support ring 22h of the lead-frame structure 31, and decreases the production cost of the semiconductor device.

Fourth Embodiment

Figure 14:
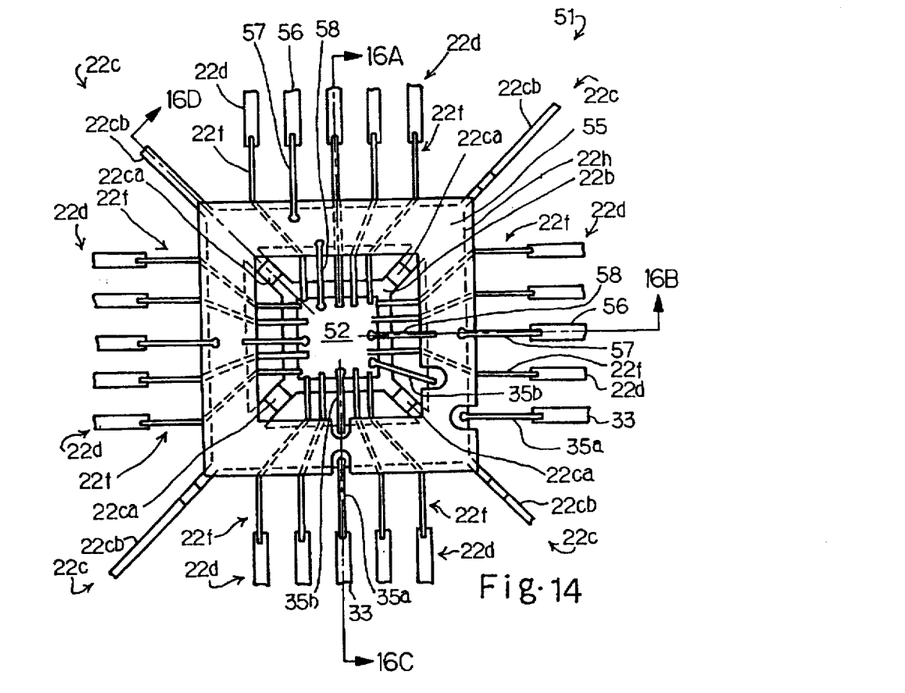
FIG. 14 is a plan view showing a lead-frame structure assembled with a semiconductor chip according to the present invention.
Figure 15:
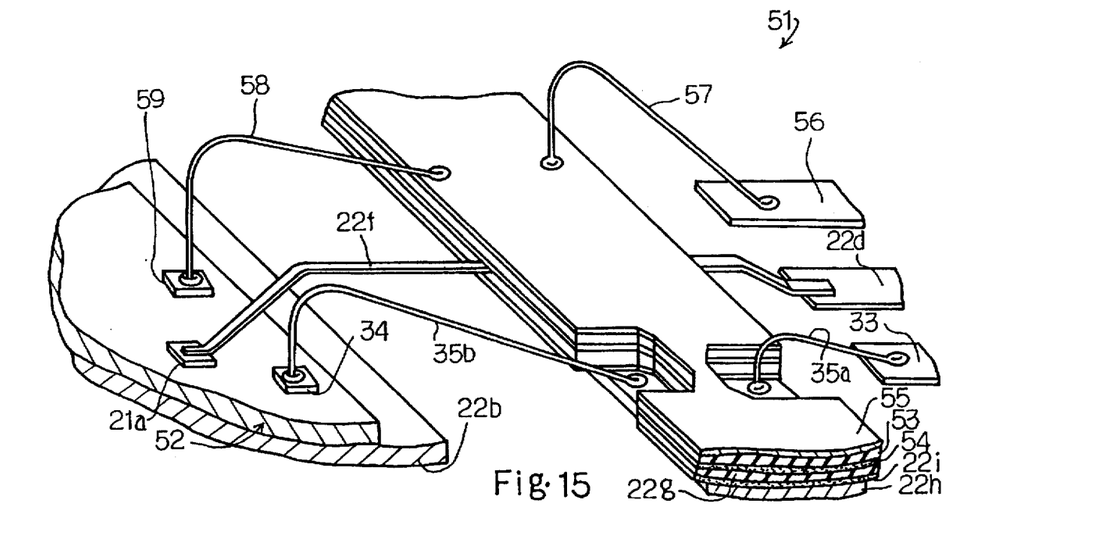
FIG. 15 is a perspective view showing wires connecting power supply leads through a conductive support ring and a conductive plate to contact electrodes of the semiconductor chip.

FIGS. 14 and 15 illustrate a lead-frame structure 51 assembled with a semiconductor chip 52, and the lead-frame structure 51 and the semiconductor chip 52 form parts of still another semiconductor device embodying the present invention. The same references as those used in FIGS. 10 and 11 designate corresponding parts and members of the lead-frame structure 41, respectively, and description is focused on a difference from the second embodiment for the sake of simplicity.

The lead-frame structure 51 further includes an insulating layer 53 bonded to the upper surface of the suspender tape 22g by means of a layer 54 of adhesive compound and a conductive plate 55 fixed to the insulating layer 53. The adhesive compound layer 22i, the suspender tape 22g, the adhesive compound layer 54, the insulating layer 53 and the conductive plate 55 are partially cut away on the inner and outer sides thereof, and the conductive support ring 22h is exposed. The conductive metal wires 35a and 35b are bonded to the exposed conductive support ring 22h, and low power voltage is supplied from the inner leads 33 through the conductive support ring 22h to the contact electrodes 34 as similar to the second embodiment.

The inner leads 56 are assigned to high power voltage, and are connected through conductive metal wires 57 to the conductive plate 55. The conductive plate 55 in turn is connected through conductive metal wires 58 to contact electrodes 59 assigned to the high power voltage. Thus, the high power voltage is supplied from the inner leads 56 through the conductive plate 55 to the contact electrodes 59, and is, in turn, distributed to the integrated circuit.

Thus, the conductive support ring 22h and the conductive plate 55 stably distribute the high and low power voltages to the integrated circuit. Of course, the electrical connection for the high power voltage may be exchanged to the electrical connection for the low power voltage.

Only one set of the conductive metal wires 35a/35b and 57/58 may be used for the power voltages, and the set may be multiplied more than two.

Figure 16A:
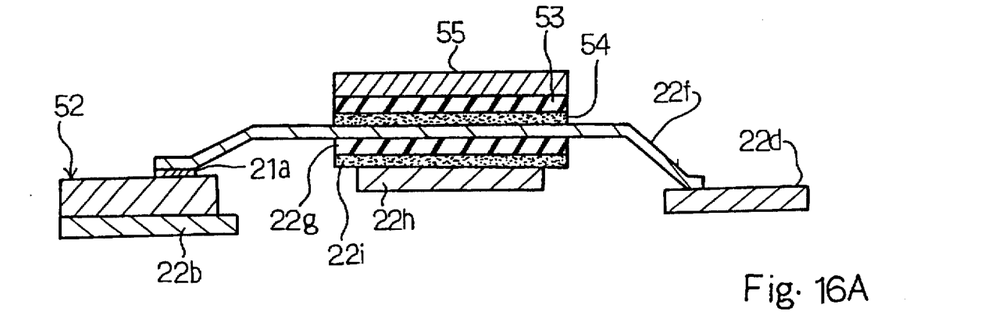
FIG. 16A is a cross sectional view taken along line 16A of FIG. 14 and showing a tape-automated bonding lead connected between an inner lead and a contact electrode.
Figure 16B:
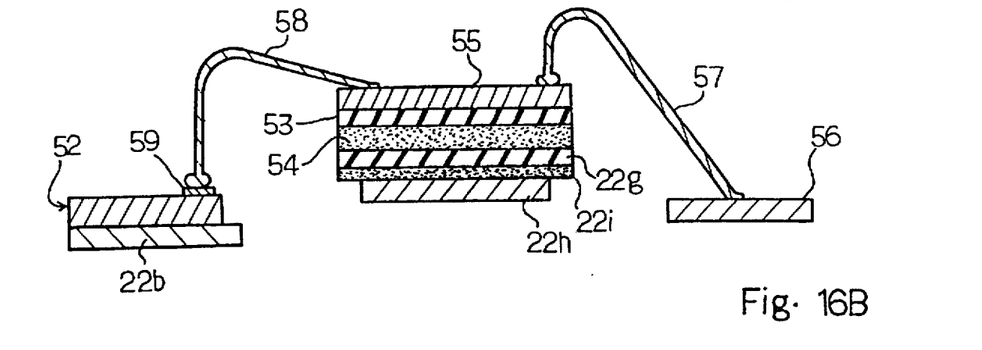
FIG. 16B is a cross sectional view taken along line 16B of FIG. 14 and showing an electrical connection for high power voltage.
Figure 16C:
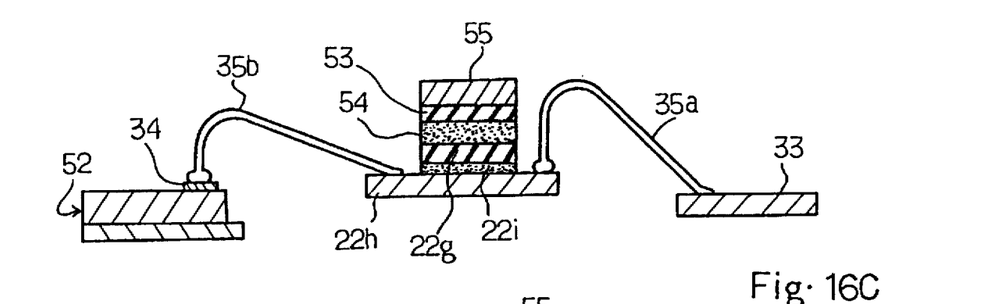
FIG. 16C is a cross sectional view taken along line 16C and showing an electrical connection for low power voltage.
Figure 16D:
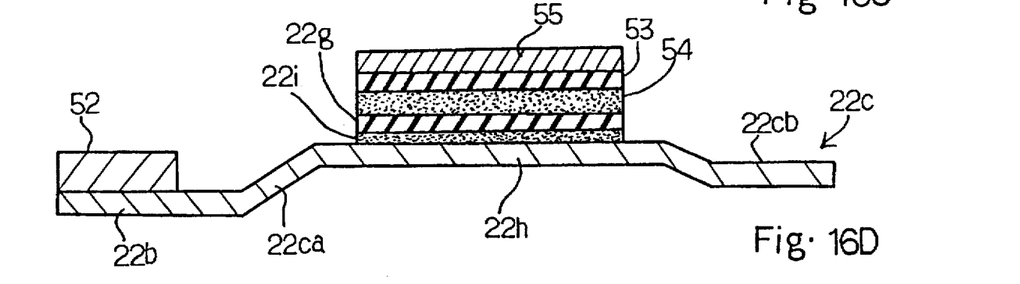
FIG. 16D is a cross sectional view taken along line 16D and showing a suspending pin fixed to a conductive support ring.

FIGS. 16A to 16D show cross sections, respectively, taken along lines 16A, 16B, 16C, and 16D. The tape-automated bonding leads 22f pass between the suspender tape 22g and the adhesive compound layer 54 as shown in FIG. 16A, and the high and low power voltages are supplied through the conductive plate 55 and the conductive support ring 22h, respectively (see FIGS. 16B and 16C). FIG. 16D illustrates the conductive support ring 22h integral with the suspension pins 22c, and the conductive support ring 22h is connected between the wide inner portions 22ca and the narrow outer portions 22cb. For this reason, even though plastic resin exerts pressure on the island 22b and the semiconductor chip 52 in a mold, the moment due to the pressure bends the narrow outer portions 22cb only, and the wide inner portions 22ca and the conductive support ring 22h keep the relative position between the semiconductor chip 52 and the tape-automated bonding leads 22f.

As will be understood, the lead-frame structure 51 achieves not only a high production yield but also stable the power supply for the high and low power voltages.

Fifth Embodiment

Figure 17:
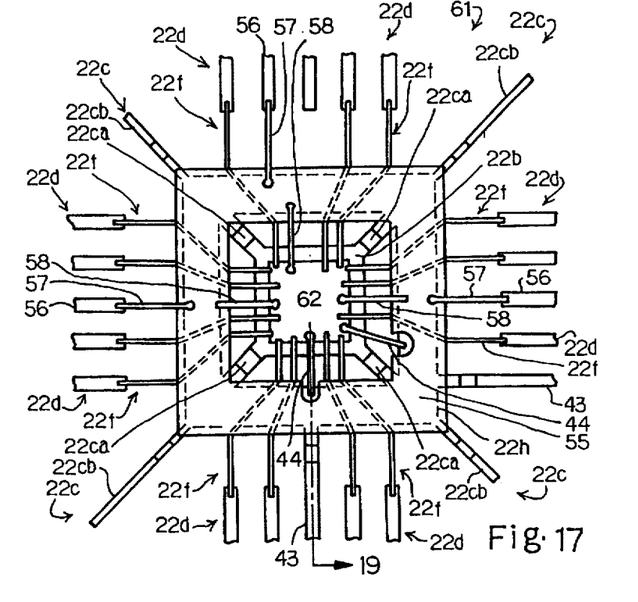
FIG. 17 is a plan view showing a lead-frame structure assembled with a semiconductor chip according to the present invention.
Figure 18:
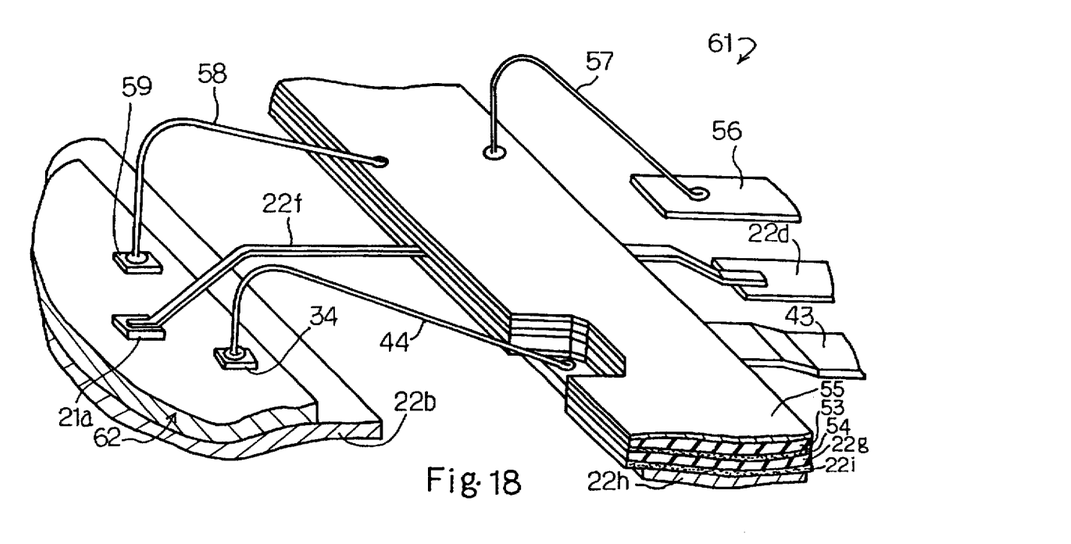
FIG. 18 is a perspective view showing electrical connection for power voltages.

FIGS. 17 and 18 illustrate a lead-frame structure 61 assembled with a semiconductor chip 62, and the lead-frame structure 61 and the semiconductor chip 62 are incorporated in a semiconductor device embodying the present invention. The lead-frame structure 61 is a compromise between the third embodiment and the fourth embodiment, and, for this reason, parts and members of the fifth embodiment are labeled with the same references used in FIGS. 12, 13, 14 and 15 without detailed description.

Figure 19:
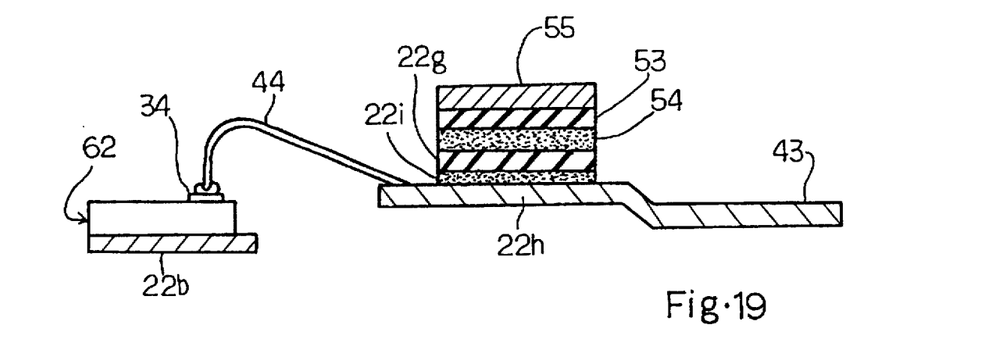
FIG. 19 is a cross sectional view taken along line 19 of FIG. 17 and showing an inner lead integral with a conductive support ring.

The inner leads 43 are prolonged, and are integral with the conductive support ring 22h as shown in FIG. 19. The adhesive compound layer 22i, the suspender tape 22g, the adhesive compound layer 54, the insulating layer 53 and the conductive plate 55 are partially cut away, and the exposed conductive support ring 22h are connected through conductive metal wires 44 to the contact electrodes 34 assigned to the low power voltage.

On the other hand, the inner leads 56 are connected through the conductive metal wires 57 to the conductive plate 55, and the conductive plate 55 is, in turn, connected through the conductive metal wires 58 to the contact electrodes 59 assigned to the high power voltage.

The conductive metal wires 44, 57 and 58 are bonded by using a wire bonding machine, and are decreased from the fourth embodiment. The wire bonding is time consuming, and the lead-frame structure 61 is economical rather than the lead-frame 51.

The lead-frame structure 61 achieves a high production yield, the stable electric supply and a low production cost.

Only one set of the electrical connections 43/22h/44 and 57/55/58 may supply the low and high power voltages to the integrated circuit, and the set of the electrical connections 43/22h/44 and 57/55/58 may be multiplied more than two. The electrical connections 43/22h/44 and 57/55/58 may supply the high power voltage and the low power voltage.

As will be appreciated from the foregoing description, the lead-frame structure according to the present invention prevents the semiconductor device from undesirable short-circuit due to a deformation during a molding stage by virtue of the support ring 22h, and the conductive support ring further achieves the stable electric power supply to the semiconductor chip.

Although particular embodiments of the present invention have been shown and described, it will be obvious to those skilled in the art that various changes and modifications may be made without departing from the spirit and scope of the present invention. For example, the support ring and the tape-automated bonding leads may be bonded to both surfaces, i.e., the top surface and the reverse surface of the insulating suspender tape.

What is claimed is:

1. A semiconductor device comprising:
   a semiconductor chip including a plurality of contact
   a lead-frame structure including:
      an island sub-structure having an island portion for mounting said semiconductor chip and a plurality of first suspension pins extending outward from said island;
      a plurality of first leads arranged around said island portion;
      a plurality of second leads having respective inner end portions respectively connected to said plurality of contact electrodes and respective outer end portions respectively connected to said plurality of first leads;
      an insulating suspender provided between said plurality of first leads and said island portion and connected to intermediate portions of said plurality of second leads so as to keep a relative relation among said plurality of second leads unchanged;
      a support member integral with and connected to said first suspension pins, supporting said insulating suspender so as to keep a relative relation between said island sub-structure and said insulating suspender; and
   a package molded for sealing said semiconductor chip and said lead-frame structure therein.

2. The semiconductor device as set forth in claim 1, wherein said first suspension pins are rigid and a plurality of second suspension pins are deformable, said support member being integral with said rigid first suspension pins and said deformable second suspension pins.

3. The semiconductor device as set forth in claim 2, in which said plurality of first leads, said second suspension pins, and said island sub-structure form in combination a lead-frame, and said plurality of second leads are tape-automated bonding leads smaller in mechanical strength than said plurality of first leads.

4. The semiconductor device as set forth in claim 1, in which said lead-frame structure further includes a first electrical path means connected between at least one of said plurality of first leads assigned to a power voltage and said support member formed of a conductive substance and a second electrical path means connected between said support member and at least one of said plurality of contact electrodes for supplying said power voltage to said semiconductor chip.

5. The semiconductor device as set forth in claim 4, in which said first electrical path and said second electrical path are implemented by a first conductive metal wire and a second conductive metal wire.

6. The semiconductor device as set forth in claim 4, in which said first electrical path and said second electrical path are implemented by an extension of said at least one of said plurality of first leads and a conductive metal wire.

7. The semiconductor device as set forth in claim 4, in which said support member is connected to one of upper and lower surfaces of said insulating suspender,
   said lead-frame structure further including
      an insulating layer covering the other of said upper and lower surfaces of said insulating suspender,
      a conductive plate member supported through said insulating layer by said insulating suspender,
      a third electrical path means connected between another at least one of said plurality of first leads assigned to another power voltage and said conductive plate member, and
      a fourth electrical path means connected between said conductive plate member and another at least one of said plurality of contact electrodes.

8. The semiconductor device as set forth in claim 7, in which said first electrical path, said second electrical path, said third electrical path and said fourth electrical path are implemented by a first conductive metal wire, a second conductive metal wire, a third conductive metal wire and a fourth conductive metal wire, respectively.

9. The semiconductor device as set forth in claim 7, in which said first electrical path, said second electrical path, said third electrical path and said fourth electrical path are implemented by an extension of said at least one of said plurality of first leads and a first conductive metal wire, a second conductive metal wire and a third conductive metal wire, respectively.

10. The semiconductor device as set forth in claim 1, further comprising:
    a plurality of second suspension pins extending outward from said support member and interspersed among said plurality of first leads.

11. The semiconductor device as set forth in claim 10, wherein said first suspension pins are wider than said second suspension pins.

12. The semiconductor device as set forth in claim 1, wherein said support member is not wider than said insulating suspender.

13. A plastic molded semiconductor device comprising:
    a lead-frame including an island for mounting a semiconductor chip and a plurality of contact leads arranged around said island;
    a plurality of tape-automated bonding leads electrically connecting said plurality of contact leads and said semiconductor chip;
    an insulating suspender tape having a first surface connected to said plurality of tape-automated bonding leads for keeping said plurality of tape-automated bonding leads spaced from one another and a second surface reverse to said first surface;
    a plurality of first suspension pins integral to and extending outward from said island; and
    a conductive support ring connected to and integral with said first suspension pins, said conductive support ring nested into and securely fastened to said second surface of said insulating suspender tape for supporting said suspender tape.

14. The semiconductor device as set forth in claim 13, wherein said conductive support ring is not wider than said insulating suspender.

15. The semiconductor device as set forth in claim 14, wherein each of said first suspension pins are wider than each of a plurality of second suspension pins so that said first suspension pins are more rigid than said second suspension pins.

16. The semiconductor device as set forth in claim 14, wherein an adhesive layer securely fastens said insulating suspender tape to said conductive support ring.

17. A plastic injection molded semiconductor device comprising:
    a lead-frame including:
       an island for mounting a semiconductor chip, said island having a periphery;
       a plurality of contact leads separated from said island and arranged around said periphery;
       a plurality of first suspension pins connected to and integral with said island, each one of said first suspension pins extending in an outward direction from said periphery of said island; and a support ring having an inner surface facing said island and an outer surface opposite said inner surface, said support ring located between said island and said plurality of contact leads, said support ring integral with said plurality of first suspension pins and connected to an outer end of each of said first suspension pins at said inner surface.

18. The semiconductor device as set forth in claim 17, further comprising:

a plurality of second suspension pins connected to said outer surface of said support ring, formed integral therewith, and extending in an outward direction from said outer surface of said support ring.

19. The semiconductor device as set forth in claim 18, wherein said support ring is not wider than an insulating suspender positioned between said plurality of contact leads and said support ring.

20. The semiconductor device as set forth in claim 19, wherein said first suspension pins are wider than said second suspension pins.

21. The semiconductor device as set forth in claim 18, further comprising:

a plurality of second leads having respective inner end portions each connecting to one of a plurality of contact electrodes on a semiconductor chip mounted on said island, and respective outer end portions respectively connected to said plurality of contact leads, said plurality of second leads relative relation maintained by an insulating suspender, which is securely fastened to said support ring.

22. The semiconductor device as set forth in claim 21, wherein an adhesive layer securely fastens said insulating suspender to said support ring.

23. The semiconductor device as set forth in claim 22, wherein said plurality of first leads, said first suspension pins, said island, and said second suspension pins form in combination a lead-frame, and said plurality of second leads are tape-automated bonding leads.

24. The semiconductor device as set forth in claim 23, further comprising:

a molded package for sealing said semiconductor chip and said lead-frame structure therein.

25. The semiconductor device as set forth in claim 24, wherein said first suspension pins and said second suspension pins are bent so as to adjust the relative heights of said semiconductor chip, said support ring, said second leads, and said insulating suspender.

* * * * *

UNITED STATES PATENT AND TRADEMARK OFFICE
CERTIFICATE OF CORRECTION

PATENT NO. : 5,731,962
DATED : March 24, 1998
INVENTOR(S) : Tomoo IMURA

It is certified that error appears in the above-identified patent and that said Letters Patent is hereby corrected as shown below:

Column 9, line 5 after "contact" insert --electrodes;--.

Signed and Sealed this

Twenty-seventh Day of October, 1998

Attest:

BRUCE LEHMAN

Attesting Officer

Commissioner of Patents and Trademarks